(12) United States Patent
Kawamura

(10) Patent No.: US 9,018,959 B2
(45) Date of Patent: Apr. 28, 2015

(54) INSULATING STATE DETECTION UNIT HAVING FAILURE DETECTOR

(75) Inventor: Yoshihiro Kawamura, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 321 days.

(21) Appl. No.: 13/445,133

(22) Filed: Apr. 12, 2012

(65) Prior Publication Data

US 2012/0262183 A1 Oct. 18, 2012

(30) Foreign Application Priority Data

Apr. 14, 2011 (JP) ................ P2011-090019

(51) Int. Cl.
*G01R 31/14* (2006.01)
*G01R 31/08* (2006.01)
*G01R 31/02* (2006.01)

(52) U.S. Cl.
CPC .................... *G01R 31/025* (2013.01)

(58) Field of Classification Search
CPC . G01R 31/12; G01R 31/2812; G01R 31/3644
USPC .......................... 324/509, 537–691
See application file for complete search history.

(56) References Cited

U.S. PATENT DOCUMENTS

| | | | |
|---|---|---|---|
| 5,818,236 A * | 10/1998 | Sone et al. ................ | 324/509 |
| 7,443,155 B2 | 10/2008 | Kawamura | |
| 8,373,424 B2 * | 2/2013 | Kawamura ................ | 324/548 |
| 2008/0079416 A1 | 4/2008 | Kawamura | |
| 2008/0310063 A1 | 12/2008 | Kawamura et al. | |
| 2009/0289639 A1 | 11/2009 | Kawamura et al. | |
| 2011/0006781 A1 * | 1/2011 | Kawamura ................ | 324/551 |
| 2011/0012606 A1 * | 1/2011 | Kawamura ................ | 324/509 |
| 2013/0342215 A1 * | 12/2013 | Kawamura ................ | 324/509 |

FOREIGN PATENT DOCUMENTS

| | | |
|---|---|---|
| CN | 101460859 A | 6/2009 |
| CN | 101918852 A | 12/2010 |
| JP | 2002-281681 A | 9/2002 |
| JP | 2004-170137 | 6/2004 |

(Continued)

OTHER PUBLICATIONS

Office Action issued Mar. 18, 2014 in counterpart Chinese Application No. 2012100934981.

(Continued)

*Primary Examiner* — Melissa Koval
*Assistant Examiner* — Courtney McDonnough
(74) *Attorney, Agent, or Firm* — Finnegan, Henderson, Farabow, Garrett & Dunner, L.L.P.

(57) ABSTRACT

An insulating state detection unit is configured to perform failure detection for switches, which connect a flying capacitor to a sample hold circuit for acquiring a charge voltage and a ground potential, by using a failure determination threshold value according to a variable value. That is to say, the insulating state detection unit is configured to decide the failure determination threshold value by taking, as a reference, a charge voltage of a capacitor of the sample hold circuit charged with electric charge amount corresponding to a charge voltage of the flying capacitor when the flying capacitor is charged with electric charge amount corresponding to an output voltage of a DC power supply.

2 Claims, 6 Drawing Sheets

(56) References Cited

FOREIGN PATENT DOCUMENTS

| | | |
|---|---|---|
| JP | 2004-170146 A | 6/2004 |
| JP | 3890503 | 12/2006 |
| JP | 3890504 | 12/2006 |
| JP | 3962991 | 6/2007 |
| JP | 2007-170983 | 7/2007 |
| JP | 2008-89323 | 4/2008 |
| JP | 2012-132725 A | 7/2012 |

OTHER PUBLICATIONS

Notification of Reasons for Refusal of Japanese Patent Application No. 2011-090019, dated Dec. 2, 2014 (2 pages).
Chinese Second Office Action of Chinese Patent Application No. 2012100934981 dated Sep. 11, 2014 (5 pages).

* cited by examiner

FAILURE DETERMINATION THRESHOLD VALUE SETTING EXAMPLE [1]
(CONVENTIONAL METHOD)
(1) 1/2 OF MEASURED VOLTAGE (max.) IN USUAL MEASUREMENT
(2) 1/2 OF MEASURED VOLTAGE (min.) IN USUAL MEASUREMENT
 (NOISE MARGIN (WORST) AT TIME OF NO SHORT CIRCUIT FAILURE)
(3) INTERMEDIATE VALUE BETWEEN (1) AND (2)

FAILURE DETERMINATION THRESHOLD VALUE SETTING EXAMPLE [2]
(THIS EMBODIMENT METHOD)

INSULATING STATE DETECTION UNIT HAVING FAILURE DETECTOR

BACKGROUND OF THE INVENTION

1. Field of the Invention

The present invention relates to an insulating state detection unit that detects an insulating state of an ungrounded power supply from a ground potential by using a flying capacitor, and particularly, relates to an insulating state detection unit having a failure detector that detects a failure of a switch switching a connection state of the flying capacitor to a charge/discharge circuit.

2. Description of the Related Art

In a vehicle using electric power as driving energy, it is usual that a DC power supply in which a voltage is boosted (for example, to 200V) is used as an ungrounded power supply by being insulated from a vehicle body. In the ungrounded power supply as described above, for detection of an insulating state of the ungrounded power supply from a ground potential, such as detection as to whether or not there is a ground fault, an insulating state detection unit using a flying capacitor is used.

The insulating state detection unit can charge, while switching internal switches thereof, the flying capacitor individually with electric charge amount corresponding to an output voltage of the DC power supply insulated from the ground potential, with electric charge amount corresponding to a ground fault resistance on a positive terminal side of the DC power supply, and with electric charge amount corresponding to a ground fault resistance on a negative terminal side of the DC power supply. Then, in a controller of the insulating state detection unit, respective charge voltages are measured, and based on measurement values thereof, the ground fault resistances on the positive terminal side and the negative terminal side are calculated, whereby the insulating state of the ungrounded power supply can be detected.

However, when a dead short circuit or a local short circuit occurs in the switches, the insulating state of the ungrounded power supply cannot be accurately detected. Accordingly, it has been proposed that the switches which should originally be switched on at the time of detecting the insulating state of the ungrounded power supply is switched to an OFF state one by one, and a state that occurs only when the switches switched to the OFF state are in an ON state is detected from a charge state of the flying capacitor, whereby a failure of each of the switches is detected.

Specifically, in a case where the flying capacitor, which is situated in a state of not discharging originally, discharges actually, it is determined that any of the switches present on a discharge circuit of the flying capacitor fails (refer to JP 3890503 B, JP 3890504 B, JP 3962991 B, and JP 2008-089323 A (patent family: U.S. Pat. No. 7,443,155 B2)).

SUMMARY OF THE INVENTION

In the event of the conventional switch failure detection mentioned above, the charge voltages of the flying capacitor and a threshold value for the failure detection are compared with each other. At this time, a noise component is sometimes contained in the measurement values of the charge voltages of the flying capacitor. In order to avoid an erroneous determination of the failure detection, which results from the presence of the noise component, it is advantageous to use, as the threshold value for the failure detection, a value higher than a voltage value of the noise component.

However, in actual, even if it is rare that such a local short circuit state of the switch occurs, it is desired that up to the local short circuit state concerned be detected, and accordingly, it cannot help but use low value as the threshold value for the failure detection so that the local short circuit state can be included as a detection target. In a failure detection using the threshold value set at such a low value, there is increased a probability that the failure is erroneously detected owing to the presence of the noise component.

The present invention has been made in consideration of the above-described circumstances. It is an object of the present invention to provide an insulating state detection unit having a failure detector that, while including the local short circuit state within a failure detection range, suppresses the erroneous failure detection owing to the noise component contained in the measurement values of the charge voltages, and is thereby capable of detecting the failure accurately.

In order to achieve the foregoing object, an insulating state detection unit according to a first aspect of the present invention includes: a flying capacitor arranged to be chargeable with electric charge amount corresponding to a power supply voltage of a DC power supply insulated from a ground potential; a voltmeter for measuring a charge voltage of the flying capacitor; a first switch capable of connecting one end of the flying capacitor to the voltmeter; a second switch capable of connecting the other end of the flying capacitor to the ground potential; and a failure detector that detects failure states of the first switch and the second switch based on a comparison result between a failure determination threshold value and a voltage value measured by the voltmeter when either one of the first switch and the second switch is in an ON state and the other of the first switch and the second switch is in an OFF state when the flying capacitor is charged with the electric charge amount corresponding to the power supply voltage of the DC power supply. The failure detector takes, as the failure determination threshold value, a voltage value obtained by lowering, to a predetermined ratio, a voltage value measured by the voltmeter when both of the first switch and the second switch are in the ON state when the flying capacitor is charged with the electric charge amount corresponding to the power supply voltage of the DC power supply, and thereafter, detects the failure states of the first switch and the second switch based on the comparison result obtained before the flying capacitor is charged again with the electric charge amount corresponding to the power supply voltage of the DC power supply.

In accordance with the insulating state detection unit according to the first aspect of the present invention, the failure determination threshold value is decided, which is obtained by lowering, to the predetermined ratio, the voltage value (the charge voltage of the flying capacitor) measured by the voltmeter immediately before the failure detection. Hence, if the voltage value measured by the voltmeter immediately before the failure detection is high, then the failure determination threshold value also becomes a high value, and if the voltage value measured by the voltmeter immediately before the failure detection is low, then the failure determination threshold value also becomes a low value.

Incidentally, in the case where the failure occurs in the first switch or the second switch, the charge voltage of the flying capacitor when one of the first switch and the second switch is in the ON state and the other is in the OFF state, the charge voltage being measured by the voltmeter at the time of the failure detection, is high if the voltage value measured by the voltmeter immediately before the failure detection, and is low if such a measured voltage value is low.

Hence, the ratio in the event of deciding the failure determination threshold value is set appropriately from the voltage value measured by the voltmeter immediately before the failure detection, whereby, even if a variable value corresponding to the voltage value measured by the voltmeter immediately before the failure detection is taken as the failure determination threshold, the detection of such failures including the local short circuit states of the first switch and the second switch can be performed.

Then, as the voltage value measured by the voltmeter immediately before the failure detection is being higher, there is increased a possibility that the failure determination threshold value may exceed a voltage value of a noise component contained in the measured voltage value concerned, or alternatively, there is also increased an extent that the failure determination threshold value exceeds the voltage value of the noise component. Therefore, as the voltage value measured by the voltmeter immediately before the failure detection is being higher, a larger margin for the noise component can be ensured for the failure determination threshold value decided based on the measured voltage value.

In such a way, while including the local short circuit state within a failure detection range, erroneous failure detection owing to the noise component contained in the voltage value (the charge voltage of the flying capacitor) measured by the voltmeter at the time of the failure detection is suppressed, and the failure can be detected accurately.

Moreover, in the insulating state detection unit according to the first aspect of the present invention, preferably, the voltmeter includes: a capacitor charged with electric charge amount corresponding to a potential of the one end of the flying capacitor; and a third switch capable of connecting the capacitor to the one end of the flying capacitor through the first switch, and the voltmeter is configured to acquire, as a measured voltage value, a voltage value corresponding to electric charge amount charged to the capacitor by turning the third switch to an ON state for a predetermined period when both of the first switch and the second switch are in the ON state. Then, preferably, the failure detector further takes, as a failure determination threshold value of the third switch, a voltage value obtained by lowering, to a predetermined ratio, a voltage value measured by the voltmeter when the third switch is in an OFF state when the capacitor is charged with the electric charge amount corresponding to the charge voltage of the flying capacitor, and thereafter, detects a failure state of the third switch based on at least either one comparison result of a comparison result between the voltage value measured by the voltmeter and a failure determination threshold value of the third switch, the failure determination threshold value being obtained before the capacitor is discharged in such a manner that the third switch is switched on and a comparison result between the voltage value measured by the voltmeter and a failure determination threshold value of the third switch, the failure determination threshold value being obtained after the capacitor is discharged in such a manner that the third switch is switched on.

In such a configuration, also in the third switch for use in allowing the voltmeter to measure the measured voltage value corresponding to the charge voltage of the flying capacitor, there is a possibility that the failure of being locked in the ON state or the OFF state may occur.

In the case where the capacitor is charged with the electric charge amount corresponding to the charge voltage of the flying capacitor, when the third switch is in the OFF state, the capacitor is in a state of being disconnected to the discharge circuit. Hence, the voltage value measured by the voltmeter should originally be a value corresponding to the charge voltage of the capacitor. Hence, when the failure occurs in the third switch that should be in the OFF state, and the third switch is in the ON state, then the capacitor discharges by the discharge circuit connected thereto through the third switch, and the voltage value measured by the voltmeter becomes zero.

Moreover, in the case where the capacitor is charged with the electric charge amount corresponding to the charge voltage of the flying capacitor, when the third switch is in the ON state, the capacitor is connected to the discharge circuit through the third switch, and is in a state of discharging the electric charge charged therein. Hence, the voltage value measured by the voltmeter should originally be zero. However, when the failure occurs in the third switch that should be in the ON state, and the third switch is in the OFF state, then the capacitor does not discharge, and turns to state of being left charged with the electric charge amount corresponding to the charge voltage of the flying capacitor. Accordingly, the voltage value measured by the voltmeter becomes a value higher than zero.

Therefore, the failure determination threshold value of the third switch is set at such a value higher than zero that allows a determination that the third switch causes the failure of being locked in the ON state when the measured voltage value is lower than the failure determination threshold value of the third switch, and that allows a determination that the third switch causes the failure of being locked in the OFF state when the measured voltage value is higher than the failure determination threshold value of the third switch.

Hence, also for the third switch owned by the voltmeter, the failure detection using the failure determination threshold value can be performed.

In addition, when the voltage value measured by the voltmeter immediately before the failure detection is high, the failure determination threshold value for the third switch is also raised in response thereto, and there can be prevented an erroneous determination that the voltage value measured by the voltmeter at the time of the failure detection exceeds the failure determination threshold value for the third switch and the failure occurs in the third switch, the erroneous determination being made owing to the noise component.

In such a way, also for the third switch owned by the voltmeter, while including the local short circuit within the failure detection range, there can be prevented such an erroneous determination that the third switch causes the failure of being locked in the OFF state, the erroneous determination being made owing to the noise component contained in the voltage value (the charge voltage of the flying capacitor) measured by the voltmeter at the time of the failure detection.

In accordance with the insulating state detection unit according to the first aspect of the present invention, while including the local short circuit state within the failure detection range, the erroneous failure detection owing to the noise component contained in the measurement values of the charge voltages is suppressed, and the failure can be thereby detected accurately.

DESCRIPTION OF THE EMBODIMENTS

Figure 1:
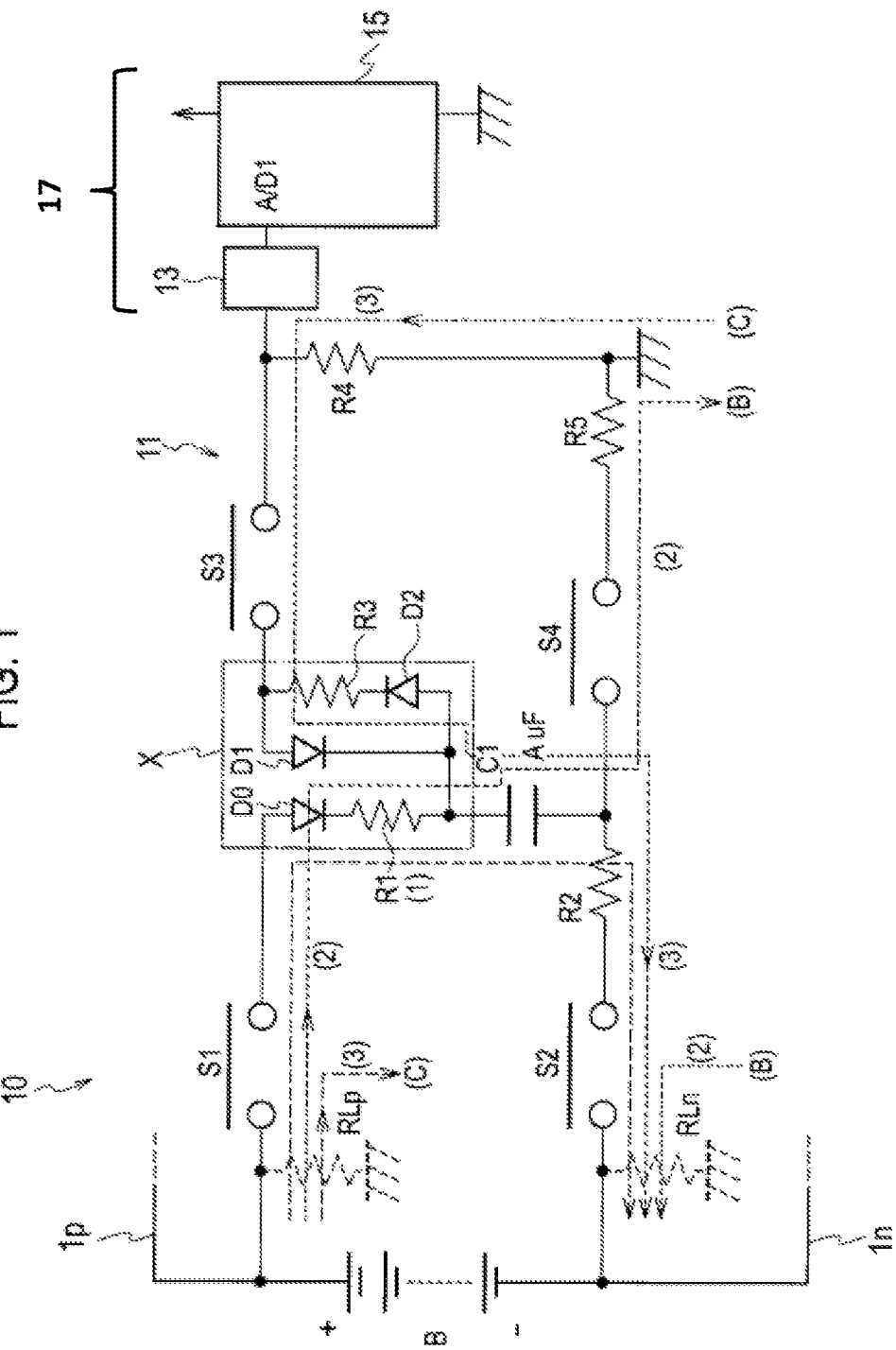
FIG. 1 is a circuit diagram illustrating an insulating state detection unit having a failure detector according to an embodiment of the present invention.

A description is made below of embodiments of the present invention while referring to the drawings.

FIG. 1 is a circuit diagram illustrating an insulating state detection unit having a failure detector (e.q., microcomputer 15 of FIG. 1) according to an embodiment of the present invention. The insulating state detection unit according to this embodiment is a unit for detecting an insulating state in a main circuit wire $1p$ on a positive terminal side or a main circuit wire $1n$ on a negative terminal side in a DC power supply B insulated from a ground potential such as a vehicle body of a vehicle (not illustrated).

Reference symbol RLp in FIG. 1 denotes a ground fault resistance on the positive terminal side, and reference symbol RLn therein denotes a ground fault resistance on the negative terminal side. Each of the ground fault resistances is a virtual resistance in the case where a ground fault occurs in each of the main circuit wire $1p$ on the positive terminal side and the main circuit wire $1n$ on the negative terminal side.

An insulating state detection unit 10 that detects the insulating states of the main circuit wires $1p$ and $1n$ includes: a ground fault detection circuit 11 including a flying capacitor C1; a sample hold circuit 13 that sample-holds a charge voltage and discharge voltage of the flying capacitor C1; and a microcomputer 15 that detects hold values of the sample hold circuit 13 and measures the charge voltage and discharge voltage of the flying capacitor C1. As the flying capacitor C1, a ceramic capacitor is used in this embodiment.

Besides the flying capacitor C1, the ground fault detection circuit 11 includes: a positive electrode side switch S1 that connects the flying capacitor C1 to a positive electrode of the DC power supply B; a negative electrode side switch S2 that connects the flying capacitor C1 to a negative electrode of the DC power supply B; a first switch S3 that connects the flying capacitor C1 to the microcomputer 15; and a second switch S4 that connects the flying capacitor C1 to the ground potential. Between the flying capacitor C1 and the positive electrode side switch S1, a first resistor R1 is connected in series. Between the flying capacitor C1 and the negative electrode side switch S2, a second resistor R2 is connected in series.

Note that, for the purpose of ensuring insulating properties for the DC power supply B in the event of measuring the charge voltage and discharge voltage of the flying capacitor C1 by the microcomputer 15 to be described later, resistors with high resistance as the same values are used as the first resistor R1 and the second resistor R2.

Figure 2:
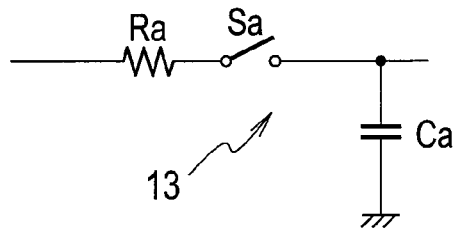
FIG. 2 is a circuit diagram illustrating a sample hold circuit.

As illustrated in a circuit diagram of FIG. 2, the sample hold circuit 13 includes: a third switch Sa in which one end is connected to a first A/D conversion port A/D1 of the microcomputer 15; a reading capacitor Ca connected between the one end of the third switch Sa and the ground potential; and a reading resistor Ra connected in series between the other end of the third switch Sa and the first switch S3.

While the third switch Sa is closing, the reading capacitor Ca is charged with a potential that appears on the one end of the third switch Sa through a fifth resistor R5.

The microcomputer 15 operates by a power supply (not illustrated) of a low voltage system lower in voltage than the DC power supply B, and the DC power supply B is insulated also from a ground potential of the microcomputer 15. The respective switches S1 to S4 of the ground fault detection circuit 11 and the third switch Sa of the sample hold circuit 13 are composed, for example, of optical MOSFETs, are insulated from the DC power supply B, and are capable of ON/OFF control by the microcomputer 15.

The first A/D conversion port A/D1 of the microcomputer 15 is connected to the first switch S3 through the sample hold circuit 13. A node between the sample hold circuit 13 and the first switch S3 is grounded through a fourth resistor R4. Between the second switch S4 and the ground potential, the fifth resistor R5 is connected. Moreover, the positive electrode side switch S1 and the first switch S3, which are located on one end side (on an upper pole in FIG. 1) of the flying capacitor C1, are connected in series to each other, and between a node therebetween and the one end of the flying capacitor C1, a current direction switching circuit X is connected.

The current direction switching circuit X is a parallel circuit, one group therein is composed of a series circuit of a first diode D0, in which a forward direction goes from the positive electrode side switch S1 toward the one end of the flying capacitor C1, and the first resistor R1, another group therein is composed of a second diode D1 in which a forward direction goes from the first switch S3 toward the one end of the flying capacitor C1, and a last one group therein is composed of a series circuit of a third diode D2, in which a forward direction goes from the one end of the flying capacitor C1 toward the first switch S3, and a third resistor R3.

In this embodiment, a voltmeter 17 is composed of the sample hold circuit 13 and the microcomputer 15, which are mentioned above.

Next, a description is made of a procedure in the event of detecting the insulating state in the insulating state detection unit 10 mentioned above. First, by the control of the microcomputer 15, the positive electrode side switch S1 and the negative electrode side S2 are switched on for a predetermined scheduled time, and in addition, the first switch S3, the second switch S4, and the third switch Sa are switched off for the scheduled time concerned. Here, the scheduled time is a time shorter than a time required for the flying capacitor C1 to be completely charged.

In such a way, a charge circuit is formed, which starts from the positive electrode of the DC power supply B, passes through the main circuit wire $1p$ on the positive terminal side, the positive electrode side switch S1, the first diode D0, the first resistor R1, the one end (on the upper pole in FIG. 1) of the flying capacitor C1, other end (on a lower pole in FIG. 1) of the flying capacitor C1, the second resistor R2, the negative electrode side switch S2, and the main circuit wire $1n$ on the negative terminal side, and then reaches the negative electrode of the DC power supply B. This charge circuit is hereinafter referred to as a first charge circuit.

Then, in the first charge circuit, the flying capacitor C1 is charged with a electric charge amount corresponding to the voltage of the DC power supply B. By this charge, the one end of the flying capacitor C1 becomes a positive electrode, and the other end thereof becomes a negative electrode.

Subsequently, by the control of the microcomputer 15, the positive electrode side switch S1 and the negative electrode side switch S2 are switched off, and the first switch S3 and the second switch S4 are switched on. In such a way, the positive electrode of the flying capacitor C1 is connected to the sample hold circuit 13 through the third diode D2, the third resistor R3, and the first switch S3, and the negative electrode of the flying capacitor C1 is connected to the ground potential through the second switch S4 and the fifth resistor R5. In such a way, the flying capacitor C1 is discharged.

Figure 3:
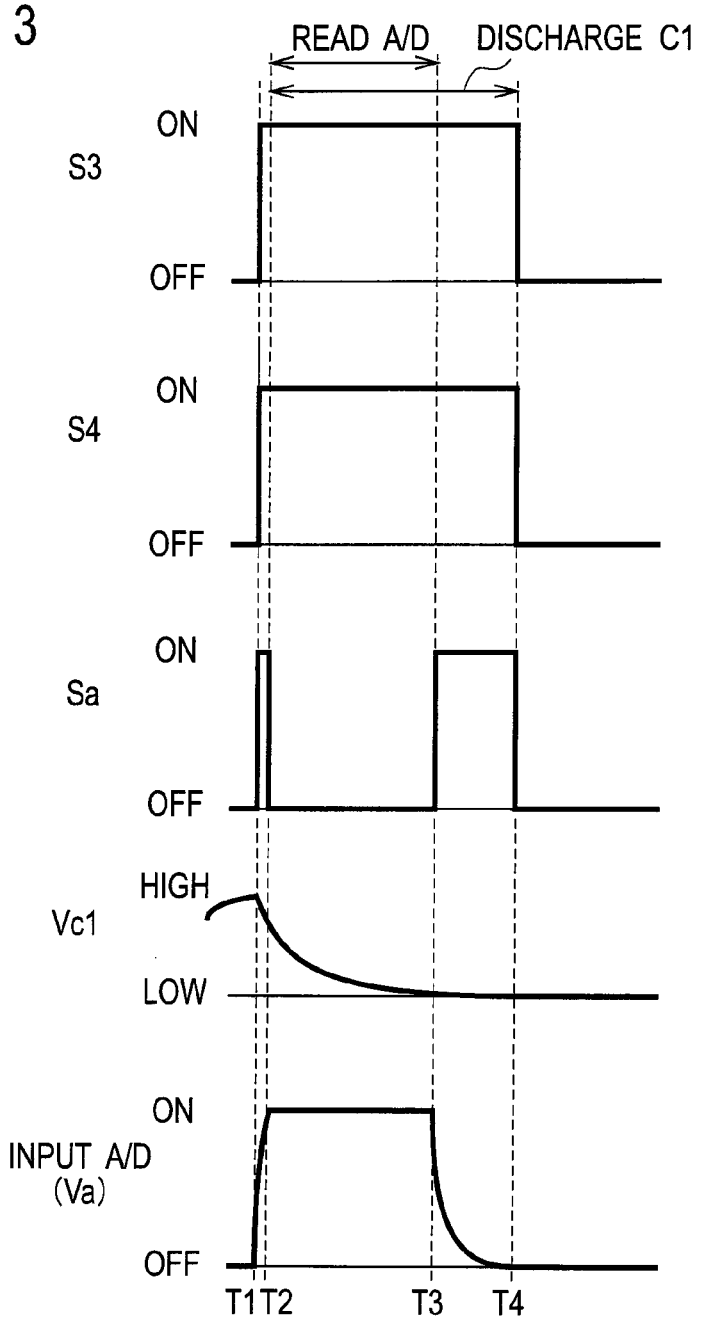
FIG. 3 is a time chart illustrating relationships between ON/OFF of respective switches and a charge state of a capacitor.

Moreover, as illustrated in a time chart of FIG. 3, at the same time when the first switch S3 and the second switch S4 are switched on (that is, at a point of time T1), the third switch Sa of the sample hold circuit 13 is switched on for a short time (a period from T1 to T2, for example, 200 to 300 μs) by the control of the microcomputer 15. In such a way, the reading capacitor Ca is charged with a potential equivalent to a difference between both end voltages of the third resistor R3 among voltages obtained by dividing the charge voltage of the flying capacitor C1 by the third resistor R3 and the fourth resistor R4.

At the time when the flying capacitor C1 starts to discharge, the flying capacitor C1 is in a state of being charged with the electric charge amount corresponding to the voltage of the DC power supply B. Therefore, in the reading capacitor Ca charged with the discharge voltage of the flying capacitor C1 immediately after the discharge start thereof, electric charge amount corresponding to a voltage division ratio of the fourth resistor R4 and the fifth resistor R5 in the electric charge amount corresponding to the voltage of the DC power supply B is accumulated.

Then, when the third switch Sa of the sample hold circuit 13 is switched off by the control of the microcomputer 15 (at a point of time T2), a potential obtained by dividing the charge voltage of the reading capacitor Ca is inputted through the sample hold circuit 13 to the first A/D conversion port A/D1 of the microcomputer 15, and is measured there. Accordingly, the microcomputer 15 is allowed to measure the charge voltage Vc1 of the flying capacitor C1, which corresponds to the voltage of the DC power supply B, from a value of such measurement, a voltage division ratio of the third resistor R3 and the fourth resistor R4, and the voltage division ratio of the fourth resistor R4 and the fifth resistor R5.

Note that, after the third switch Sa of the sample hold circuit 13 is switched off, the first switch S3 and the second switch S4 are left switched on also during a period of measuring the charge voltage Vc1 of the flying capacitor C1, and accordingly, the flying capacitor C1 continues to be in the discharge state.

Moreover, after the measurement of the charge voltage Vc1 of the flying capacitor C1 is ended (at a point of time T3), the third switch sa of the sample hold circuit 13 is switched on by the control of the microcomputer 15. In such a way, the flying capacitor C1 and the reading capacitor Ca are turned to the discharge state. At a point of time when each of the flying capacitor C1 and the reading capacitor Ca is completely discharged (that is, at a point of time T4), the respective switches S3, S4, and Sa are switched off by the control of the microcomputer 15.

Then, after the flying capacitor C1 and the reading capacitor Ca are completely discharged, the positive electrode side switch S1 and the second switch S4 are switched on and the negative electrode side switch S2 and the first switch S3 are switched off for the above-mentioned scheduled time by the control of the microcomputer 15.

In such a way, a charge circuit is formed, which starts from the positive electrode of the DC power supply B, passes through the main circuit wire 1p on the positive terminal side, the positive electrode side switch S1, the first diode D0, the first resistor R1, the one end of the flying capacitor C1, the other end of the flying capacitor C1, the second switch S4, the fifth resistor R5, (the ground potential,) the ground fault resistance RLn on the negative terminal side, and the main circuit wire 1n on the negative terminal side, and then reaches the negative electrode of the DC power supply B. This charge circuit is hereinafter referred to as a second charge circuit.

Then, in the second charge circuit, the flying capacitor C1 is charged with electric charge amount corresponding to the ground fault resistance RLn on the negative terminal side. By this charge, the one end of the flying capacitor C1 becomes the positive electrode, and the other end thereof becomes the negative electrode.

Subsequently, by the control of the microcomputer 15, the positive electrode side switch S1 and the negative electrode side switch S2 are switched off, and in addition, the first switch S3 and the second switch S4 are switched on (at the point of time T1 in FIG. 3), and the third switch Sa of the sample hold circuit 13 is switched on for a short time (the period from T1 to T2, for example, 200 to 300 μs).

Thereafter, during a period until the third switch Sa of the sample hold circuit 13 is switched on again by the control of the microcomputer 15 (that is, a period from T2 to T3 in FIG. 3), the microcomputer 15 is allowed to measure a charge voltage Vc1− of the flying capacitor C1, which corresponds to the ground fault resistance RLn on the negative terminal side, in a similar way to the event of the measurement of the charge voltage Vc1 of the flying capacitor C1, which corresponds to the voltage of the DC power supply B.

Then, after the flying capacitor C1 and the reading capacitor Ca are completely discharged, the negative electrode side switch S2 and the first switch S3 are switched on and the positive electrode side switch S1 and the second switch S4 are switched off for the above-mentioned scheduled time by the control of the microcomputer 15.

In such a way, a charge circuit is formed, which starts from the positive electrode of the DC power supply B, passes through the main circuit wire 1p on the positive terminal side, the ground fault resistance RLp on the positive terminal side, (the ground potential,) the fourth resistor R4, the first switch S3, the second diode D1, the one end of the flying capacitor C1, the other end of the flying capacitor C1, the second resistor R2, the negative electrode side switch S2, and the main circuit wire 1n on the negative terminal side, and then reaches the negative electrode of the DC power supply B. This charge circuit is hereinafter referred to as a third charge circuit.

Then, in the third charge circuit, the flying capacitor C1 is charged with electric charge amount corresponding to the ground fault resistance RLp on the positive terminal side. By this charge, the one end of the flying capacitor C1 becomes the positive electrode, and the other end thereof becomes the negative electrode.

Subsequently, by the control of the microcomputer 15, the positive electrode side switch S1 and the negative electrode side switch S2 are switched off, and in addition, the first switch S3 and the second switch S4 are switched on (at the point of time T1 in FIG. 3), and the third switch Sa of the sample hold circuit 13 is switched on for a short time (the period from T1 to T2, for example, 200 to 300 μs).

Thereafter, during a period until the third switch Sa of the sample hold circuit 13 is switched on again by the control of the microcomputer 15 (that is, the period from T2 to T3 in FIG. 3), the microcomputer 15 is allowed to measure a charge voltage Vc1+ of the flying capacitor C1, which corresponds to the ground fault resistance RLp on the positive terminal side, in a similar way to the event of the measurement of the charge voltage Vc1 of the flying capacitor C1, which corresponds to the voltage of the DC power supply B, and to the event of the measurement of the charge voltage Vc1− of the flying capacitor C1, which corresponds to the ground fault resistance RLn on the negative terminal side. Then, the flying capacitor C1 and the reading capacitor Ca are completely discharged.

Incidentally, among the charge voltage Vc1 of the flying capacitor C1, which corresponds to the voltage of the DC power supply B, the charge voltage Vc1− of the flying capacitor C1, which corresponds to the ground fault resistance RLn on the negative terminal side, the charge voltage Vc1+ of the flying capacitor C1, which corresponds to the ground fault resistance RLp on the positive terminal side, and a parallel synthesis resistance R of the ground fault resistance RLp on the positive terminal side and the ground fault resistance RLn on the negative terminal side, there is a relationship represented by the following relational equation:

$$1/R = (RLp + RLn)/(RLp \cdot RLn) \text{ proportional to } \{(Vc1+) + (Vc1-)\}/Vc1$$

Accordingly, by using the above-described relational equation, the microcomputer 15 can calculate the parallel synthesis resistance R of the ground fault resistance RLp on the positive terminal side and the ground fault resistance RLn on the negative terminal side, and can detect the insulating state of the DC power supply B.

Note that, with regard to the ceramic capacitor used as the flying capacitor C1 in the ground fault detection circuit 11 of this embodiment, capacitance of the ceramic capacitor is largely changed by a DC bias. Moreover, the capacitance is largely changed also by an environmental temperature of the insulating state detection unit 10, an individual difference of the ceramic capacitor used as the flying capacitor C1, and the like.

Accordingly, for the purpose of eliminating an influence of these changes of the capacitance, a procedure of the measurement of the respective charge voltages Vc1, Vc1− and Vc1+, which is performed by the computer 15, may be changed. A description is made below of such a measurement procedure.

When the capacitance of the flying capacitor C1 drops down below that at a ordinary state, charge magnitude of the flying capacitor C1 in the case of charging the same for a fixed time becomes higher than that at the ordinary state, and discharge magnitude of the flying capacitor C1 becomes high for a while after the discharge is started.

Meanwhile, when the capacitance of the flying capacitor C1 rises up more than that at the ordinary state, the charge magnitude of the flying capacitor C1 in the case of charging the same for the fixed time becomes lower than that at the ordinary state, and the discharge magnitude of the flying capacitor C1 becomes low for the while after the discharge is started.

When a little time elapses after the discharge is started, the discharge of the flying capacitor C1 approaches saturation. Accordingly, even if the capacitance of the flying capacitor C1 fluctuates from that at the ordinary state, a large difference does not occur in the discharge magnitude of the flying capacitor C1 from that time.

That is to say, though fluctuations of the charge magnitude owing to variations of capacitance characteristics of the flying capacitor C1 are large, variations of the discharge voltage at the point of time when a little time elapses after the discharge of the flying capacitor C1 is started become small. Specifically, the discharge voltage VD1 at the point of time when the discharge of the flying capacitor C1 is started after the flying capacitor C1 is charged for the fixed time (t1) and the discharge voltage VD2 at the point of time when a time t2 elapses after the discharge of the flying capacitor C1 is started are represented by the following equations:

$$VD1 = V0 \cdot [1 - \exp\{-t1/(C1 \cdot a \cdot RC)\}]$$

$$VD2 = VD1 \cdot [\exp\{-t2/(C1 \cdot a \cdot RD)\}]$$

where V0: charge voltage; C1: capacitance of the flying capacitor C1; RC: charge resistance; RD: discharge resistance; and a: variation coefficient of the capacitance of the flying capacitor C1 (that is, ratio with respect to the capacitance at the ordinary state).

As obvious from the above-described equations, in the case where the variation occurs in a direction where the capacitance of the flying capacitor C1 drops, the charge voltage VD1 at the point of time when the discharge is started becomes high. Moreover, the discharge voltage VD2 at the point of time when the time t2 elapses after the discharge is started also becomes high. On the contrary, in the case where the variation occurs in a direction where the capacitance of the flying capacitor C1 rises, the charge voltage VD1 at the point of time when the discharge is started becomes low. Moreover, the discharge voltage VD2 at the point of time when the time t2 elapses after the discharge is started also becomes low.

As described above, when the capacitance of the flying capacitor C1 fluctuates with respect to that at the ordinary state, it is conceived that an amount that the charge magnitude of the flying capacitor fluctuates with respect to that at the ordinary state is cancelled in such a manner the charge magnitude of the flying capacitor C1 fluctuates for a while after the discharge is started.

Hence, in the case of obtaining, from the discharge voltage of the flying capacitor C1, the charge voltage in the event of charging the flying capacitor C1 for the fixed time, at the time of obtaining the charge voltage V0, higher accuracy is achieved by the following Eq. (1) using the discharge voltage VD2 than by the following Eq. (2) using the discharge voltage VD1:

$$V0 = VD2/\{(\text{discharge ratio by } t2 \text{ and } C1 \cdot RD) - (\text{discharge ratio by } t1 \text{ and } C1 \cdot RC)\} \quad \text{Eq. (1)}$$

$$V0 = VD1/(\text{charge ratio by } t1 \text{ and } C1 \cdot RC) \quad \text{Eq. (2)}$$

(where the discharge ratio: residual ratio of the electric charges after the discharge; and the charge ratio: residual ratio of the electric charges after the charge)

Accordingly, after a little time elapses after the discharge of the flying capacitor C1 is started, by the control of the microcomputer 15, the positive electrode side switch S1 and the negative electrode side switch S2 are switched off, and in addition, the first switch S3, the second switch S4, and the third switch Sa are switched on (at the point of time T1 in FIG. 3). Then, the potential obtained by dividing the charge voltage of the reading capacitor Ca charged during the period until the third switch Sa is switched off by the control of the microcomputer 15 after the elapse of the short time is measured from the input of the first A/D conversion port A/D1 of the microcomputer 15. Then, based on the value thus measured, the charge voltage of the flying capacitor C1 is measured by the microcomputer 15.

As described above, the respective charge voltages Vc1, Vc1− and Vc1+ of the flying capacitor C1 may be obtained from the discharge voltage VD2 measured after a little time elapses after the discharge of the flying capacitor C1 is started. Moreover, the charge voltage Vc1 of the flying capacitor C1 charged with the electric charge amount corresponding to the power supply voltage of the DC power supply B may be obtained from the discharge voltage VD2, and the charge voltage Vc1− of the flying capacitor C1, which corresponds to the ground fault resistance RLn on the negative terminal side, and the charge voltage Vc1+ of the flying capacitor C1, which corresponds to the ground fault resistance RLp on the positive terminal side, may be obtained from the discharge voltage VD1 at the point of time when the discharge is started.

Note that a pace at which the discharge of the flying capacitor C1 approaches the saturation differs depending on the capacitance of the flying capacitor C1. Hence, the point of time when the discharge magnitude of the flying capacitor C1 in which the capacitance is not ordinary state is not largely changed from the discharge quantity of the flying capacitor C1 in which the capacitance is ordinary state (that is, the point of time when a little time elapses after the discharge is started) differs depending on whether the capacitance is higher or lower than that at the ordinary state.

Accordingly, with regard to the point of time when the discharge magnitude of the flying capacitor C1 in which the capacitance is not ordinary state is not largely changed from the discharge magnitude of the flying capacitor C1 in which the capacitance is ordinary state, there may be obtained an average thereof in the cases where the capacitance of the flying capacitor C1 is higher and lower than that at the ordinary state. Then, a point of time, which is obtained by such averaging, may be set as the point of time of measuring the discharge voltage VD2.

Incidentally, when the respective switches S1 to S4 of the ground fault detection circuit 11 cause a failure of being locked in an ON state, it becomes impossible to properly detect the insulating state of the DC power supply B in the above-mentioned procedure. Accordingly, the above-mentioned microcomputer 15 also functions as the failure detector for performing the failure detection for the respective switches S1 to S4 at the same time of detecting the insulating state of the DC power supply B.

The failure detection for the respective switches S1 to S4 is performed in such a manner that the switches S1 to S4 which are originally switched on are turned to an OFF state one by one, and a state that occurs only when the switches S1 to S4 turned to the OFF state are in the ON state is detected from the charge state of the flying capacitor C1.

In the event of the failure detection for the respective switches S1 to S4, a charge voltage Va (a measured voltage value) of the reading capacitor Ca of the sample hold circuit 13, which is equivalent to the charge voltage of the flying capacitor C1, and a threshold value (a failure determination threshold value) are compared with each other.

Figure 4:
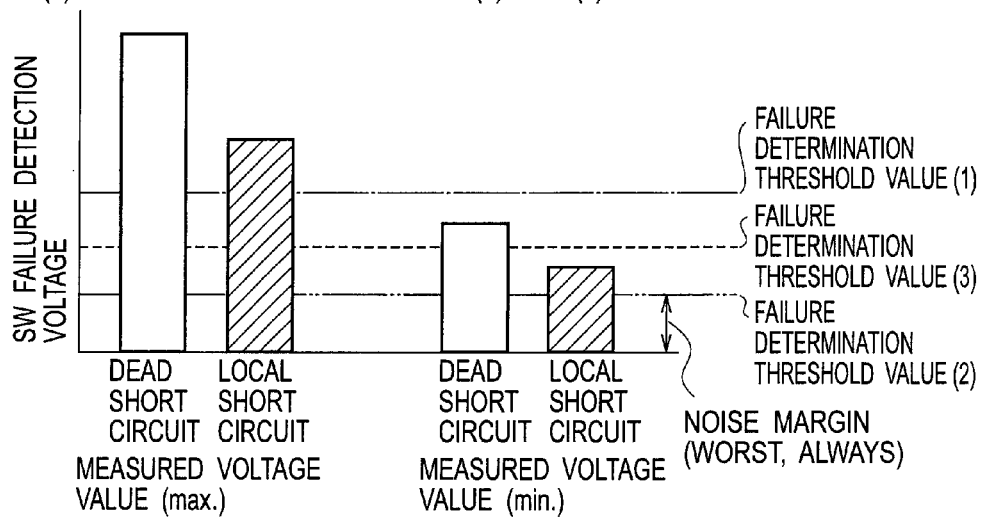
FIG. 4 is an explanatory diagram in a case of using failure determination threshold values as fixed values for switch failure detection for a ground fault detection circuit.

Here, referring to FIG. 4, a description is made of the case of setting the failure determination threshold value at a fixed value as heretofore.

In the failure of the switches, there are a dead short circuit state and a local short circuit state. In the case where such a switch failure occurs in the insulating state detection unit 10, then with regard to the charge voltage Va (the measured voltage value) of the reading capacitor Ca, which is measured, by the microcomputer 15, as a value corresponding to the charge voltage of the flying capacitor C1, the charge voltage Va concerned at the time of the dead short circuit state takes a higher value than at the time of the local short circuit state.

Hence, for example, in the case where 50% of a measured voltage value in usual measurement by the microcomputer 15 is taken as the failure determination threshold value, if a maximum value within an assumed range of the measured voltage value in the case where the failure of the dead short circuit state occurs in each of the switches (that is, the maximum value is at a level indicated by a bar graph of the dead short circuit at the time of a measured voltage value (max.) in FIG. 4) is taken as a reference of the failure determination threshold value, then the failure determination threshold value takes a highest value (a failure determination threshold value (1) in FIG. 4).

Meanwhile, if a minimum value within the assumed range of the measured voltage value in the case where the failure of the dead short circuit state occurs in the switch (that is, the minimum value is at a level indicated by a bar graph of the dead short circuit at the time of a measured voltage value (min.) in FIG. 4) is taken as a reference of the failure determination threshold value, then the failure determination threshold value takes a lowest value (a failure determination threshold value (2) in FIG. 4).

If the failure determination threshold value is set at the failure determination threshold value (1) in FIG. 4, which is the highest, then in the event where the failure of the local short circuit state occurs in the switch, in the case where the voltage value measured by the microcomputer 15 is the minimum value within the assumed range (that is, the minimum value is at a level indicated by a bar graph of the local short circuit at the time of the measured voltage value (min.) in FIG. 4), the failure cannot be detected.

As opposed to this, if the failure determination threshold value is set at the failure determination threshold value (2) in FIG. 4, which is the lowest, then in the event where the failure of the local short circuit state occurs in the switch, even in the case where the voltage value measured by the microcomputer 15 is the minimum value within the assumed range (that is, the minimum value is at the level indicated by the bar graph of the local short circuit at the time of the measured voltage value (min.) in FIG. 4), the failure can be detected.

Instead, in the case where the failures of the dead short circuit state and the local short circuit state do not occur in the switch, a level difference is lost between a noise component (at a level of a noise margin (worst) in FIG. 4) contained in the voltage value measured by the microcomputer 15 and the failure determination threshold value. Therefore, though no failure occurs in the switch, an erroneous determination of the failure detection becomes prone to occurring owing to the noise component contained in the measured voltage value.

Note that it is also conceived to set, as the failure determination threshold value, an intermediate value between the failure determination threshold value (1) and the failure determination threshold value (2) in FIG. 4 (that is, the intermediate value is a failure determination threshold value (3) in FIG. 4). However, in this case, in the event where the failure of the local short circuit state occurs, when the voltage value measured by the microcomputer 15 is the minimum value (at the level indicated by the bar graph of the local short circuit at the time of the measured voltage value (min.) in FIG. 4) or is a value approximate to the minimum value concerned, it becomes impossible to detect the failure.

Accordingly, in the insulating state detection unit 10 according to this embodiment, a voltage value (equivalent to "a voltage value lowered to a predetermined ratio") as 50% of the charge voltage Va (the voltage value measured by the microcomputer 15) of the reading capacitor Ca of the sample hold circuit 13 is taken as the failure determination threshold value. Here, the charge voltage Va is measured by the microcomputer 15 immediately before the failure detection, and is a voltage at the time when the flying capacitor C1 is charged with the electric charge amount corresponding to the power supply voltage of the DC power supply B.

Figure 5:
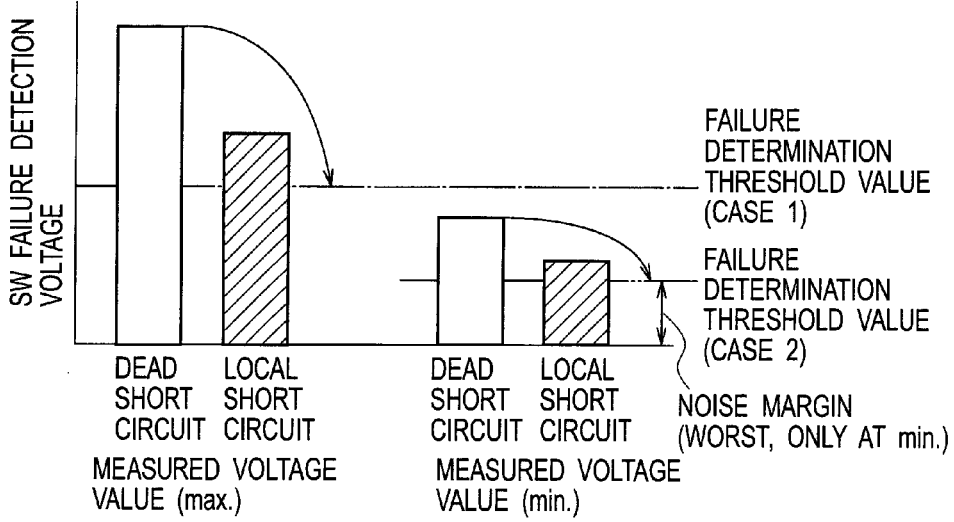
FIG. 5 is an explanatory diagram according to the embodiment of the present invention, illustrating a case of using failure determination threshold values as variable values for the switch failure detection for the ground fault detection circuit.

For example, as illustrated in FIG. 5, in the case where the voltage value measured by the microcomputer 15 immediately before the failure detection is a maximum value within the assumed range in the case where the failure of the dead short circuit state occurs in the switch (that is, the maximum value is at a level indicated by the bar graph of the dead short circuit at the time of the measured voltage value (max.) in FIG. 5), then the failure determination threshold value becomes at a level of a half of the measured voltage value, which is indicated by a line of Case 1 in FIG. 5.

At this time, based on a determination from the charge state of the flying capacitor C1, circumstances of a volume of the noise component contained in the voltage value measured by the microcomputer 15, and the like, the voltage value measured by the microcomputer 15 is at the maximum level within the assumed range. Hence, it is assumed that, also when the failure of the local short circuit state occurs in the switch, the voltage value measured by the microcomputer 15 reaches the maximum value within the assumed range (that is, the maximum value is at the level indicated by the bar graph of the local short circuit at the time of the measured voltage value (max.) in FIG. 5).

The maximum value of the voltage value measured by the microcomputer 15 when the failure of the local short circuit state occurs in the switch (that is, the maxim value is at the level indicated by the bar graph of the local short circuit at the time of the measured voltage value (max.) in FIG. 5) is obviously higher than a level of the failure determination threshold value, which is indicated by the line of Case 1 in FIG. 5. Moreover, the maximum value within the assumed range of the noise component contained in the voltage value measured by the microcomputer 15 (that is, the maximum value is at a level of a noise margin (worst) in FIG. 5) is obviously lower than the failure determination threshold value.

Moreover, in the case where the voltage value measured by the microcomputer 15 immediately before the failure detection is a minimum value within the assumed range in the case where the failure of the dead short circuit state occurs in the switch (that is, the minimum value is at the level indicated by the bar graph of the dead short circuit at the time of the measured voltage value (min.) in FIG. 5), the failure determination threshold value becomes at a level of a half of the measured voltage value, which is indicated by a line of Case 2 in FIG. 5.

At this time, based a determination from the charge state of the flying capacitor C1, the voltage value measured by the microcomputer 15 is at the minimum level within the assumed range. Hence, it is assumed that, also when the failure of the local short circuit state occurs in the switch, the voltage value measured by the microcomputer 15 becomes approximately the minimum value within the assumed range (that is, the minimum value is at the level indicated by the bar graph of the local short circuit at the time of the measured voltage value (min.) in FIG. 5).

The minimum value of the voltage value measured by the microcomputer 15 when the failure of the local short circuit state occurs in the switch (that is, the minimum value is at the level indicated by the bar graph of the local short circuit at the time of the measured voltage value (min.) in FIG. 5) is obviously higher than a level of the failure determination threshold value, which is indicated by a line of Case 2 in FIG. 5. Moreover, the maximum value within the assumed range of the noise component contained in the voltage value measured by the microcomputer 15 (that is, the maximum value is at the level of the noise margin (worst) in FIG. 5) is obviously lower than the failure determination threshold value.

Hence, such failure determination threshold values according to variable values are decided by taking, as references, the voltages measured by the microcomputer 15 when the flying capacitor C1 is charged with the electric charge amount corresponding to the power supply voltage of the DC power supply B immediately before the failure detection, whereby, in the case where the failure occurs in the switch, the failure can be detected accurately without narrowing a detection range of the local short circuit state.

Moreover, as the failure determination threshold value is being higher, there is increased a possibility that the failure determination threshold value may exceed the voltage value of the noise component contained in the charge voltage of the flying capacitor C1, or alternatively, there is also increased an extent that the failure determination threshold value exceeds the voltage value of the noise component. Therefore, as the voltage value measured by the microcomputer 15 immediately before the failure detection is being higher, a larger margin for the noise component can be ensured for the failure determination threshold value decided based on the measured voltage value, the local short circuit state can be included within the failure detection range, and at the same time, the failure detection can be performed accurately based on the measured voltage value of the microcomputer 15.

Next, prior to a description of a specific procedure in the event of deciding the failure determination threshold value by the above-mentioned variable value, a description is made of a failure detection procedure for the respective switches S1 to S4 of the ground fault detection circuit 11 present in the insulating state detection unit 10 and the third switch Sa of the sample hold circuit 13 present therein.

With regard to the positive electrode side switch S1 that connects the positive electrode of the DC power supply B and the flying capacitor C1 to each other, and the negative electrode side switch S2 that connects the negative electrode of the DC power supply B and the flying capacitor C1 to each other, the positive electrode side switch S1 and the negative electrode side switch S2 are turned to the ON state one by one after the flying capacitor C1 is discharged, and thereafter, it is confirmed whether or not the flying capacitor C1 is charged, whereby the failures thereof can be detected.

That is to say, if the failure of being locked in the ON state occurs in the negative electrode side switch S2 when the positive electrode side switch S1 is turned to the ON state and the negative electrode side switch S2 is turned to the OFF state, then the flying capacitor C1 that should not be originally charged is charged by the DC power supply B. In a similar way, also in the case where the failure of being locked in the ON state occurs in the positive electrode side switch S1 when the positive electrode side switch S1 is turned to the OFF state and the negative electrode side switch S2 is turned to the ON state, the flying capacitor C1 that should not be originally charged is charged by the DC power supply B.

Hence, the charge voltage (the measured voltage value) of the reading capacitor Ca of the sample hold circuit 13, which is equivalent to the charge voltage of the flying capacitor C1, is thereafter measured by the microcomputer 15, and it is confirmed whether the measured charge voltage is lower than the failure determination threshold value (that is, no failure)

or higher than the same (that is, a failure), whereby the failures of the positive electrode side switch S1 and the negative electrode side switch S2 can be detected.

Here, a procedure as below becomes necessary in order to decide the failure determination threshold value for the positive electrode side switch S1 and the negative electrode side switch S2 as the variable value in which the voltage value measured by the microcomputer 15 is taken as the reference when the flying capacitor C1 is charged with the electric charge amount corresponding to the power supply voltage of the DC power supply B immediately before the failure detection.

That is to say, as mentioned above, into the period until the positive electrode side switch S1 and the negative electrode side switch S2 are alternately switched on after the flying capacitor C1 is discharged, it is necessary to interpose the step of charging the flying capacitor C1 with the power supply voltage of the DC power supply B by switching on both of the positive electrode side switch S1 and the negative electrode side switch S2.

However, in terms of the procedure, it is impossible to interpose the step as described above. Therefore, this embodiment is not applied to the failure determination threshold value for use in the failure detection for the positive electrode side switch S1 and the negative electrode side switch S2, and as heretofore, the fixed value is used as the failure determination threshold value.

Next, with regard to the first switch S3 that connects the sample hold circuit 13 and the flying capacitor C1 to each other, in a state where the flying capacitor C1 is charged, and where the reading capacitor Ca of the sample hold circuit 13 is discharged, the second switch S4 and the third switch Sa are turned to the ON state, the first switch S3 is turned to the OFF state, and it is thereafter confirmed whether or not the reading capacitor Ca is charged, whereby the failure of the first switch S3 concerned can be detected.

Moreover, with regard to the second switch S4 that connects the ground potential and the flying capacitor C1 to each other, in the state where the flying capacitor C1 is charged, and where the reading capacitor Ca of the sample hold circuit 13 is discharged, the first switch S3 and the third switch Sa are turned to the ON state, the second switch S4 is turned to the OFF state, and it is thereafter confirmed whether or not the reading capacitor Ca is charged, whereby the failure of the second switch S4 concerned can be detected.

Here, a procedure as below becomes necessary in order to decide the failure determination threshold value for the positive electrode side switch S1 and the negative electrode side switch S2 as the variable value in which the voltage value measured by the microcomputer 15 is taken as the reference when the flying capacitor C1 is charged with the electric charge amount corresponding to the power supply voltage of the DC power supply B immediately before the failure detection.

That is to say, before such a state as mentioned above comes, where the flying capacitor C1 is charged, and the reading capacitor Ca of the sample hold circuit 13 is discharged, it is necessary to execute the step of charging the flying capacitor C1 with the power supply voltage of the DC power supply B by switching on both of the positive electrode side switch S1 and the negative electrode side switch S2, the step of charging the reading capacitor Ca of the sample hold circuit 13 with the electric charge amount corresponding to the charge voltage of the flying capacitor C1, and the step of discharging the reading capacitor Ca thus charged.

In terms of the procedure, it is possible to execute these steps in advance. Therefore, this embodiment is applied to the failure detection for the first switch S3 and the second switch S4, and the variable value is used as the failure determination threshold value.

Note that, with regard to the third switch Sa of the sample hold circuit 13, the third switch Sa is turned to the OFF state in a state where the reading capacitor Ca is charged, and it is thereafter confirmed whether or not the reading capacitor Ca is charged, whereby the failure of the third switch Sa concerned can be detected. Moreover, the third switch Sa is turned to the ON state in a state where the reading capacitor Ca is discharged, and it is thereafter confirmed whether or not the reading capacitor Ca is charged, whereby the failure of the third switch Sa concerned can be detected.

Here, in terms of the procedure, it is possible to charge the reading capacitor Ca before turning the third switch Sa to the OFF state, and to discharge the reading capacitor Ca before turning the third switch Sa to the ON state. Therefore, this embodiment is applied also to the failure detection for the third switch Sa, and the variable value is used as the failure determination threshold value.

Figure 6:
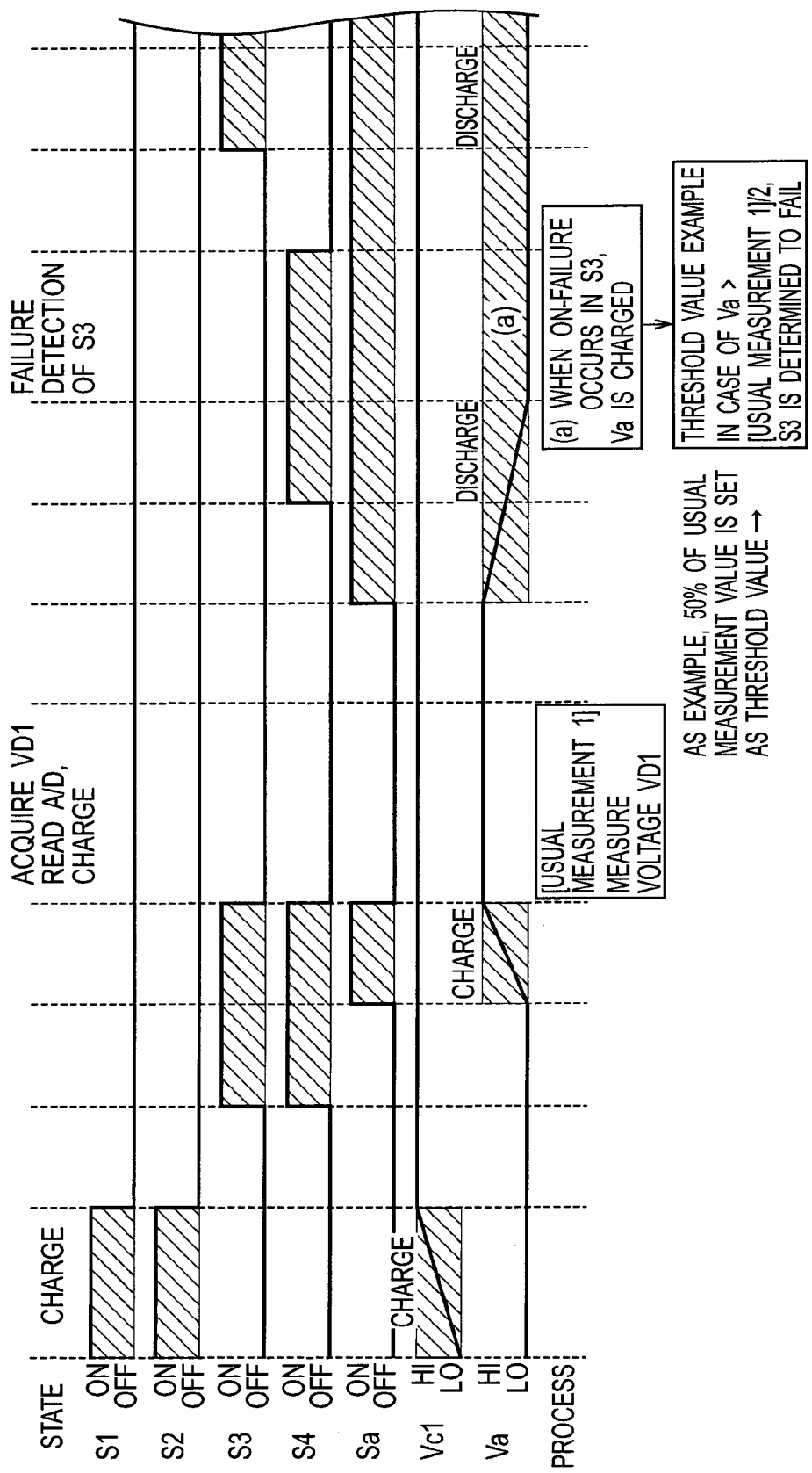
FIG. 6 is a timing chart illustrating ON/OFF timing of the respective switches in an event of performing the switch failure detection by using the failure determination threshold values as the variable values.
Figure 7:
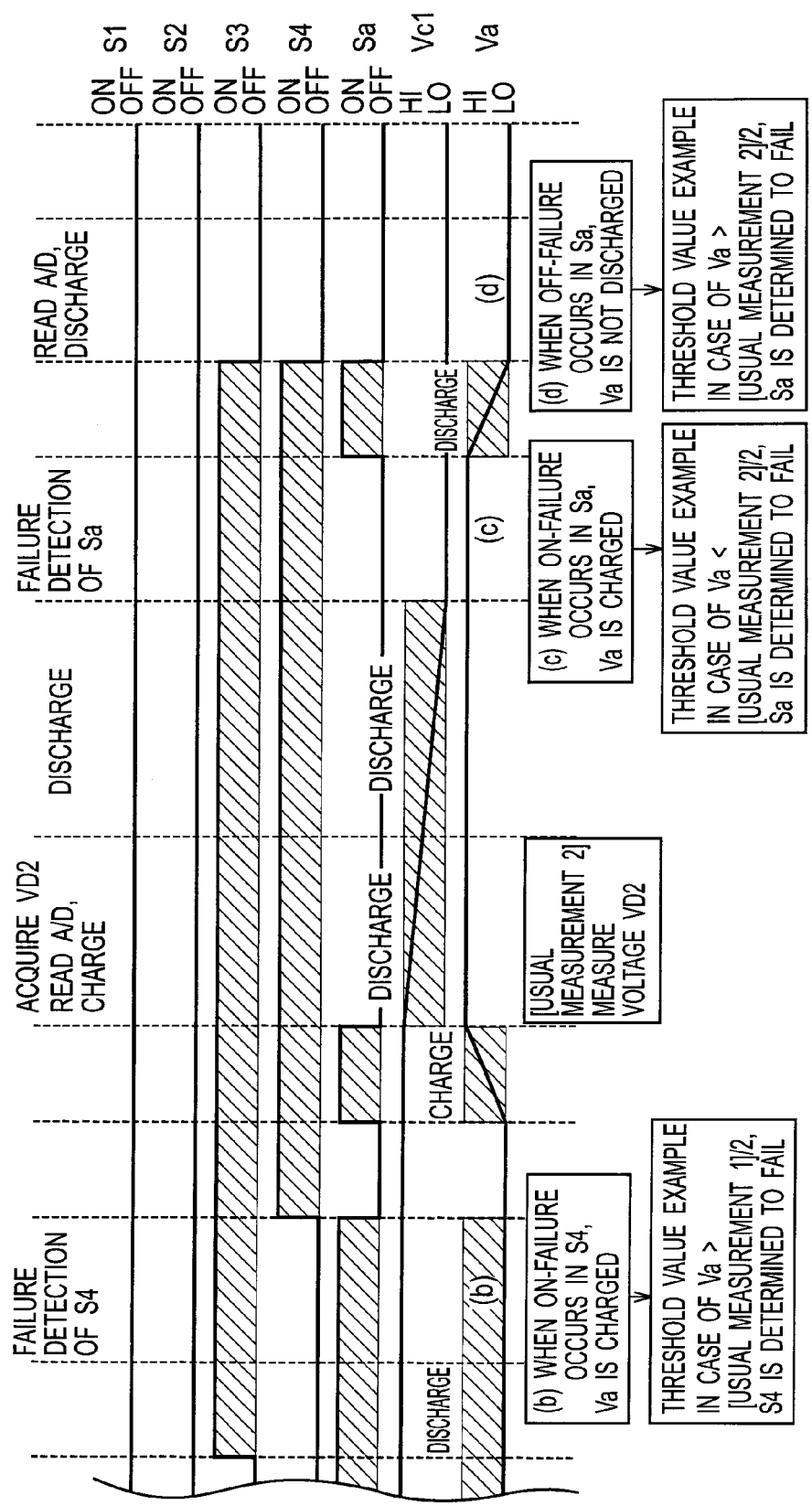
FIG. 7 is a timing chart illustrating ON/OFF timing of the respective switches in the event of performing the switch failure detection by using the failure determination threshold values as the variable values.

Next, referring to timing charts of FIGS. 6 and 7, a description is made of the procedures in the event of performing the failure detection for the first switch S3, the second switch S4, and the third switch Sa by using the failure determination threshold value as the variable value.

First, as illustrated in FIG. 6, the positive electrode side switch S1 and the negative electrode side switch S2 are turned to the ON state, and the first switch S3, the second switch S4, and the third switch Sa are turned to the OFF state, whereby the flying capacitor C1 is charged with the power supply voltage of the DC power supply B. In such a way, the charge voltage Vc1 of the flying capacitor C1 rises.

Subsequently, after the positive electrode side switch S1 and the negative electrode side switch S2 are turned to the OFF state, the first switch S3 and the second switch S4 are turned to the ON state, and the third switch Sa is turned to the ON state late for a moment, whereby the reading capacitor Ca of the sample hold circuit 13 is charged with the electric charge charged in the flying capacitor C1. In such a way, the charge voltage Va of the reading capacitor Ca rises.

Accordingly, when there elapses a time sufficient for charging the reading capacitor Ca, then the first switch S3, the second switch S4, and the third switch Sa are turned to the OFF state, thereafter, the charge voltage Va of the reading capacitor Ca is measured by the microcomputer 15, and the charge voltage Va thus measured is acquired as the measured voltage value ([Usual Measurement 1]). Note that the charge voltage Va of the reading capacitor Ca, which is acquired as the measured voltage value here, can be used for obtaining the above-mentioned discharge voltage VD1 at the point of time when the discharge is started in the case where the flying capacitor C1 is discharged after being charged for the fixed time (t1).

Then, the voltage value as 50% of the measured voltage value in [Usual Measurement 1] is taken as the value that is the failure determination threshold value for use in the failure detection for the first switch S3 and the second switch S4.

Next, the third switch Sa is turned to the ON state to start the discharge of the reading capacitor Ca, and the second switch S4 is turned to the ON state late for a little. When a time corresponding to a time constant of the reading capacitor Ca elapses after the third switch Sa is switched on, the reading capacitor Ca should be discharged completely; however, when the failure of being locked in the ON state occurs in the third switch S3, the reading capacitor Ca is charged with the electric charge charged in the flying capacitor C1 on and after the second switch S4 is turned to the ON state.

Accordingly, after a little time elapses after the second switch S4 is switched on (that is, at the point of time when the reading capacitor Ca should originally be discharged completely), the charge voltage Va of the reading capacitor Ca is measured as the measured voltage value by the microcomputer 15, and the charge voltage Va thus measured is compared with the above-mentioned failure determination threshold value(=[Usual Measurement 1]/2)(during a period (a) in FIG. 6). Then, in the case where the measured voltage value (the charge voltage Va of the reading capacitor Ca) is higher than [Usual Measurement 1]/2, it is determined that the failure of being locked in the ON state occurs in the first switch S3.

Subsequently, after the second switch S4 is turned to the OFF state, the first switch S3 is turned to the ON state late for a little. Here, in the case where the measured voltage value (the charge voltage Va of the reading capacitor Ca) is not higher than [Usual Measurement 1]/2 before the second switch S4 is turned to the OFF state, then this state should continue at least until a point of time when the first switch S3 is switched on.

Accordingly, after a little time elapses after the first switch S3 is switched on, as illustrated in FIG. 7, the charge voltage Va of the reading capacitor Ca is measured as the measured voltage value by the microcomputer 15, and the charge voltage Va thus measured is compared with the above-mentioned failure determination threshold value(=[Usual Measurement 1]/2)(during a period of (b) in FIG. 7). Then, in the case where the measured voltage value (the charge voltage Va of the reading capacitor Ca) is higher than [Usual Measurement 1]/2), it is determined that the failure of being locked in the ON state occurs in the second switch S4.

Next, the third switch Sa is turned to the OFF state at the same time when the second switch S4 is turned to the ON state, the flying capacitor C1 is allowed to start the discharge by the discharge circuit, and the third switch Sa is turned to the ON state soon thereafter, and the reading capacitor Ca of the sample hold circuit 13 is charged with the electric charge amount corresponding to the charge voltage Vc1 of the flying capacitor C1.

Moreover, when there elapses a time sufficient for the charge of the reading capacitor Ca, then the third switch Sa is turned to the OFF state, the charge voltage Va of the reading capacitor Ca is measured by the microcomputer 15, and the charge voltage Va thus measured is acquired as the measured voltage value ([Usual Measurement 2]). Note that the charge voltage Va of the reading capacitor Ca, which is acquired as the measured voltage value here, can be used for obtaining the above-mentioned discharge voltage VD2 at the point of time when the time t2 elapses after the discharge of the flying capacitor C1 is started in the case where the flying capacitor C1 concerned is discharged after being charged for the fixed time (t1).

Then, the voltage value as 50% of the measured voltage value in [Usual Measurement 2] is taken as the value that is the failure determination threshold value for use in the failure detection for the third switch Sa.

After another little time elapses, that is, after timing when the flying capacitor C1 should be discharged completely passes after the elapse of the time corresponding to the time constant of the flying capacitor C1 after the second switch S4 is switched on and the third switch Sa is switched off, then the charge voltage Va of the reading capacitor Ca is measured as the measured voltage value by the microcomputer 15, and the charge voltage Va thus measured is compared with the above-mentioned failure determination threshold value (=[Usual Measurement 2]/2) (during a period (c) in FIG. 7). Then, in the case where the measured voltage value (the charge voltage Va of the reading capacitor Ca) is lower than [Usual Measurement 2]/2, it is determined that the failure of being locked in the ON state occurs in the third switch Sa.

Subsequently, the third switch Sa is turned to the ON state. Here, in the case where the measured voltage value (the charge voltage Va of the reading capacitor Ca) is not lower than [Usual Measurement 2]/2 before the third switch Sa is turned to the ON state, then this state should continue at least until a point of time when the third switch Sa is switched on.

Accordingly, after timing when the reading capacitor Ca should be discharged completely passes after the elapse of the time corresponding to the time constant of the flying capacitor C1 after the third switch Sa is switched on, then the first switch S3, the second switch S4, and the third switch Sa are turned to the OFF state, the charge voltage Va of the reading capacitor Ca is measured as the measured voltage value by the microcomputer 15, and the charge voltage Va thus measured is compared with the above-mentioned failure determination threshold value (=[Usual Measurement 2]/2) (during a period (d) in FIG. 7). Then, in the case where the measured voltage value (the charge voltage Va of the reading capacitor Ca) is higher than [Usual Measurement 2]/2, it is determined that the failure of being locked in the ON state occurs in the third switch Sa.

Figure 8:
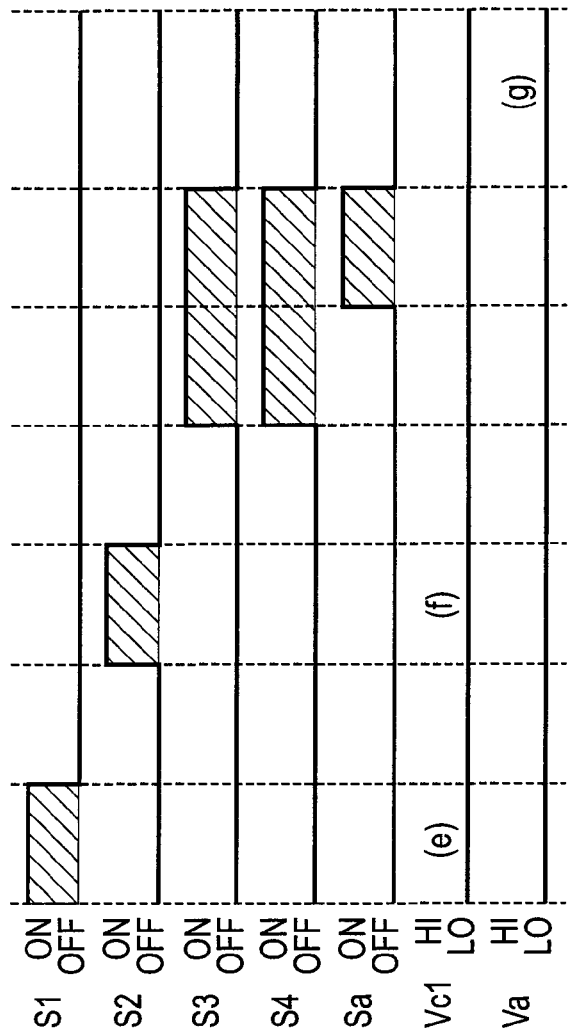
FIG. 8 is a timing chart illustrating ON/OFF timing of the respective switches in an event of performing the switch failure detection by using the failure determination threshold values as the variable values.

In a procedure in the event of performing the failure detection for the positive electrode side switch S1 and the negative electrode side switch S2 by using the fixed value as the failure determination threshold value, first, the positive electrode side switch S1 is switched on for a fixed time as illustrated in a timing chart of FIG. 8. At this time (during a period (e) of FIG. 8), when the failure of being locked in the ON state occurs in the negative electrode side switch S2, the flying capacitor C1 is charged with the electric charge amount corresponding to the power supply voltage of the DC power supply B.

Moreover, when a little time elapses after the positive electrode side switch S1 is switched on for the fixed time and is turned to the OFF state, next, the negative electrode side switch S2 is switched on for a fixed time. At this time (during a period (f) in FIG. 8), when the failure of being locked in the ON state occurs in the positive electrode side switch S1, the flying capacitor C1 is charged with the electric charge amount corresponding to the power supply voltage of the DC power supply B.

Then, when a little time elapses after the negative electrode side switch S2 is switched on for the fixed time and is turned to the OFF state, next, the first switch S3 and the second switch S4 are switched on, and the third switch Sa is also switched on late for a little. Moreover, when a time sufficient for the charge of the reading capacitor Ca elapses, the first switch S3, the second switch S4, and the third switch Sa are turned to the OFF state, and thereafter, the charge voltage Va of the reading capacitor Ca is measured by the microcomputer 15, and the charge voltage Va thus measured is acquired as the measured voltage value (during a period (g) in FIG. 8).

Here, in the case where the measured voltage value thus acquired is higher than the failure determination threshold value according to the predetermined fixed value, it is determined that the failure of being locked in the ON state occurs in at least either of the positive electrode side switch S1 and the negative electrode side switch S2.

Incidentally, the procedure performed after the negative electrode side switch S2 is switched on for the fixed time and is turned to the OFF state is performed also during a period after a little time elapses after the positive electrode side switch S1 is switched on for the fixed time and is turned to the OFF state until the negative electrode side switch S2 is switched on for the fixed time, whereby the failure determination for the positive electrode side switch S1 and the negative electrode side switch S2 may be individually performed. In this case, before each of the positive electrode side switch S1 and the negative electrode side switch S2 is switched on for the fixed time, the procedure of switching on the third switch Sa for discharging the reading capacitor Ca is executed.

As described above, in accordance with the insulating state detection unit 10 according to this embodiment, the failure detection for the first switch S3, the second switch S4, and the third switch Sa is performed by using the failure determination threshold values according to the variable values. Specifically, the failure determination threshold values are decided by taking, as the references, the charge voltages Va ([Usual Measurement 1], [Usual Measurement 2]) of the reading capacitor Ca of the sample hold circuit 13, which is charged with the electric charge amount corresponding to the charge voltage Vc1 of the flying capacitor C1 when the flying capacitor C1 is charged with the electric charge amount corresponding to the power supply voltage of the DC power supply B.

Therefore, even if the noise component is contained in the voltage value measured by the microcomputer 15, in the case where the failure occurs in each of the first switch S3, the second switch S4, and the third switch Sa, the failure can be accurately detected without narrowing the detection range of the local short circuit state.

That is to say, while including the local short circuit state in the detection range, the noise margin for the noise component contained in the voltage value measured by the microcomputer 15 is largely ensured in the failure determination threshold value, and the failure detection can be accurately performed.

Note that, in this embodiment, the voltage value corresponding to the charge voltage Vc1 of the flying capacitor C1 is measured by using the sample hold circuit 13, and therefore, it is defined that the measured voltage value is the charge voltage Va of the reading capacitor Ca of the sample hold circuit 13. However, the present invention is also applicable to the case of directly measuring the charge voltage Vc1 of the flying capacitor C1 without using the sample hold circuit 13. In this case, the charge voltage Vc1 of the flying capacitor C1 is equivalent to the measured voltage value, and based on this, the failure determination threshold value is decided.

Moreover, in this embodiment, the description has been made of the case where "the predetermined ratio" is 50%; however, the predetermined ratio may be more than 50% or less than 50%. Moreover, a ratio equivalent to "the predetermined ratio" may be allowed to differ between the failure determination threshold value for the first switch S3 and the second switch S4 and the failure determination threshold value for the third switch Sa.

Furthermore, in this embodiment, the description has been made of the case of performing the failure detection for the third switch Sa of the sample hold circuit 13 together with the failure detection for the first switch S3 and the second switch S2; however, no matter whether the sample hold circuit 13 may be present, such a configuration for performing the failure detection for the third switch Sa may be omitted.

Moreover, how to obtain the charge voltage Vc1 of the flying capacitor C1 is not limited to the method described in this embodiment, and is arbitrary.

What is claimed is:
1. An insulating state detection unit comprising:
a flying capacitor arranged to be chargeable with an electric charge amount corresponding to an output voltage of a DC power supply insulated from a ground potential;
a voltmeter for measuring a charge voltage of the flying capacitor;
a first switch disposed between a first end of the flying capacitor and the voltmeter for connecting or disconnecting the first end of the flying capacitor to or from the voltmeter;
a second switch disposed between a second end of the flying capacitor and the voltmeter for connecting or disconnecting the second end of the flying capacitor to or from the ground potential; and
a failure detector that couples to the first switch and the second switch and that detects failure states of the first switch and the second switch based on a comparison result between a failure determination threshold value and a voltage value measured by the voltmeter when either one of the first switch and the second switch is in an ON state and the other of the first switch and the second switch is in an OFF state and when the flying capacitor is charged with the electric charge amount corresponding to the output voltage of the DC power supply, wherein
the failure detector obtains the failure determination threshold value by lowering, by a predetermined percentage, a voltage value measured by the voltmeter when both of the first switch and the second switch are in the ON state and when the flying capacitor is charged with the electric charge amount corresponding to the output voltage of the DC power supply, and thereafter, detects the failure states of the first switch and the second switch based on the comparison result obtained before the flying capacitor is charged again with the electric charge amount corresponding to the output voltage of the DC power supply.

2. The insulating state detection unit according to claim 1, wherein
the voltmeter includes: a capacitor charged with an electric charge amount corresponding to a potential of the first end of the flying capacitor; and a third switch disposed between the capacitor and the flying capacitor for connecting or disconnecting the capacitor to or from the first end of the flying capacitor through the first switch,
the voltmeter is configured to acquire, as a measured voltage value, a voltage value corresponding to electric charge amount charged to the capacitor by turning the third switch to an ON state for a predetermined period of time when both of the first switch and the second switch are in the ON state, and
the failure detector further obtains a failure determination threshold value of the third switch by lowering, by a predetermined percentage, a voltage value measured by the voltmeter when the third switch is in an OFF state and when the capacitor is charged with the electric charge amount corresponding to the charge voltage of the flying capacitor, and thereafter, further detects a failure state of the third switch based on at least one of
a first comparison result between the voltage value measured by the voltmeter and a first failure determination threshold value of the third switch, the first failure determination threshold value being obtained before the capacitor is discharged in such a manner that the third switch is switched on, and a second comparison result between the voltage value measured by the voltmeter and a second failure determination threshold value of the third switch, the second failure determination threshold value being obtained after the capacitor is discharged in such a manner that the third switch is switched on.

* * * * *